(12) United States Patent
Wilcox

(10) Patent No.: US 6,771,089 B1
(45) Date of Patent: Aug. 3, 2004

(54) TEST FIXTURE HAVING AN ADJUSTABLE CAPACITANCE AND METHOD FOR TESTING A SEMICONDUCTOR COMPONENT

(75) Inventor: Richard Jacob Wilcox, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/159,193

(22) Filed: May 29, 2002

(51) Int. Cl.[7] .................................................. G10R 31/26
(52) U.S. Cl. ..................................... 324/765; 324/158.1
(58) Field of Search ............................ 324/73.1, 158.1, 324/754, 755, 757, 763, 765, 756

(56) References Cited

U.S. PATENT DOCUMENTS

| | | | |
|---|---|---|---|
| 5,430,305 A | * 7/1995 | Cole et al. | ............. 250/559.07 |
| 5,488,309 A | * 1/1996 | Farwell | ....................... 324/617 |
| 5,523,694 A | 6/1996 | Cole, Jr. | ..................... 324/751 |
| 5,781,017 A | 7/1998 | Cole, Jr. et al. | ............ 324/751 |
| 5,825,171 A | * 10/1998 | Shin | .......................... 324/73.1 |
| 5,844,416 A | 12/1998 | Campbell et al. | ........... 324/750 |
| 6,020,748 A | 2/2000 | Jeng | ............................ 324/755 |
| 6,078,183 A | 6/2000 | Cole, Jr. | ..................... 327/752 |
| 6,121,059 A | 9/2000 | Liu | .............................. 438/14 |
| 6,140,826 A | 10/2000 | Jeng | ........................... 324/755 |
| 6,391,667 B1 | * 5/2002 | Hashimoto | ................... 438/17 |
| 6,466,007 B1 | * 10/2002 | Prazeres da Costa et al. | ....................... 324/158.1 |
| 6,535,006 B2 | * 3/2003 | Shahriari et al. | ........... 324/755 |

* cited by examiner

*Primary Examiner*—Evan Pert
*Assistant Examiner*—Tung X. Nguyen
(74) *Attorney, Agent, or Firm*—The Cavanagh Law Firm

(57) ABSTRACT

A test fixture having an adjustable capacitance (10) and a method for testing a semiconductor component using the test fixture (10). The test fixture (10) includes a loadboard (12) having a semiconductor component receiving area (14), and a power supply input terminal (16) capable of receiving an unbuffered constant current bias signal from a power supply (18). A semiconductor component is coupled to the semiconductor component receiving area (14). A switched capacitor network (21) mounted on the test fixture (10) is configured so that a desired load capacitance is coupled to the power supply input terminal (16) when the semiconductor component is initialized. Then the switched capacitor network (21) is configured so that substantially zero capacitance is coupled to the power supply input terminal. Power supply voltage fluctuations are mapped while the semiconductor component is biased with the power supply and receiving a voltage alteration signal from a laser.

8 Claims, 2 Drawing Sheets

US 6,771,089 B1

TEST FIXTURE HAVING AN ADJUSTABLE CAPACITANCE AND METHOD FOR TESTING A SEMICONDUCTOR COMPONENT

FIELD OF THE INVENTION

This invention relates, in general, to a semiconductor component and, more particularly, to an apparatus and method for analyzing the semiconductor component.

BACKGROUND OF THE INVENTION

The manufacture of semiconductor components involves many complex, expensive, and time consuming process steps. Typically, semiconductor devices are formed in a semiconductor substrate in wafer form using a series of processing steps that build the semiconductor devices in a vertical direction to conserve silicon real estate. This allows the formation of more semiconductor components from a single semiconductor wafer, thereby decreasing the cost to manufacture them. A semiconductor wafer is laterally partitioned into a plurality semiconductor die. Each semiconductor die is partitioned into a plurality of active device regions using isolation techniques such as trench formation or a local oxidation of silicon (LOCOS). Semiconductor devices are then manufactured in each of the active device regions using masking layers, photolithography, wet and dry etches, and doping techniques known to those skilled in the art. The semiconductor devices are electrically coupled to each other using a plurality of metal layers vertically separated from each other by a dielectric material. The wafers are sawed or diced into individual semiconductor components that are then packaged in plastic or ceramic packages.

An important step in the manufacturing process is testing the completed semiconductor components to ensure they operate properly. Likewise, it is important to test any semiconductor components that were originally operational, but failed during use. This latter type of testing, commonly referred to as failure analysis, is particularly difficult to perform because of the testing sensitivity required. A variety of techniques may be used to perform failure analysis including electron beam induced current (EBIC), biased resistive contrast imaging (BRCI), charge-induced voltage alteration (CIVA), and biased optical beam induced current (biased OBIC). Two techniques that have gained widespread acceptance in analyzing defective semiconductor components are light induced voltage alteration (LIVA) and thermally induced voltage alteration (TIVA). In the LIVA technique, a voltage change of a constant current power supply is monitored as the surface of the semiconductor component is scanned using a light beam. In the TIVA technique, a voltage change of a constant current power supply is monitored as the surface of the semiconductor component is scanned using a focused laser beam that produces localized heating of metal layers of the semiconductor component.

In the past, when using either the LIVA or TIVA technique to analyze a semiconductor component such as, for example, a microprocessor, the microprocessor was placed in a test fixture that did not have a load capacitance coupled to any of the microprocessor power supply pins. A power supply having an internal capacitance was coupled to the test fixture to bias the microprocessor with a high power constant current power supply bias signal. After the microprocessor had been biased, it was initialized with a predetermined signal pattern to place it in the correct state. Then, either a light or a thermally induced voltage alteration signal was rastered over the surface of the microprocessor while biasing it with the constant current, and fluctuations in the voltage of the constant current power supply were monitored. This technique was adequate for older generation microprocessors because their operating frequencies and power requirements were sufficiently low so as to not impact the power supply. However, as microprocessor operating frequencies and power requirements have increased, the output bias voltage from the power supplies has been degraded. More particularly, the microprocessors create large power fluctuations at the power supply because they switch states so quickly and draw such large amounts of current when switching states that the power supply is unable to react quickly enough to compensate for the sudden change in power requirements. This creates a "voltage droop" in the bias voltage. If the "voltage droop" falls outside the microprocessor's bias design specifications, the microprocessor will be unable to achieve the proper initialization state.

One technique for mitigating the "voltage droop" has been to add a capacitance as close as possible to the microprocessor power supply pins. The capacitance provides additional power to the microprocessor when it is switching so quickly that the power supply is unable to instantaneously adjust to the increased power demand. A drawback to this approach is that the capacitance filters out the slight voltage perturbations that the test engineer is trying to measure, while the large voltage perturbations take longer to become noticeable.

Accordingly, what is needed is an apparatus and method for testing semiconductor components that allows initializing semiconductor components in a capacitively coupled configuration and measuring small power supply perturbations in a capacitively decoupled configuration.

SUMMARY OF THE INVENTION

The present invention satisfies the foregoing need by providing a fixture capable of coupling a range of capacitance values to a semiconductor component and a method for analyzing or testing the semiconductor component using the fixture. In accordance with one embodiment, the fixture comprises a loadboard on which a switched capacitor network is coupled to a semiconductor component receiving area. The switched capacitor network is coupled to the input connector and to a supply terminal suitable for receiving an unbuffered signal.

In accordance with another aspect of the present invention, a method for analyzing the semiconductor component using the loadboard is provided. The method comprises coupling a capacitor to the semiconductor component, then transmitting an initialization pattern to the semiconductor component. After the initialization pattern has been loaded into the semiconductor component, the capacitor is decoupled from the semiconductor component. In one embodiment, a constant current is applied to the semiconductor component and a voltage alteration signal such as, for example, a laser signal, is applied to a portion of the semiconductor component. While the laser signal is being applied, power supply voltage changes or fluctuations are monitored and, preferably, recorded. In addition to recording the magnitude of the voltage change, the location at which the voltage alteration signal is applied to the semiconductor component is recorded. In this embodiment, the voltage alteration signal is applied to another portion of the semiconductor component and the magnitude of the voltage change and the location of the measurement are recorded.

This process is continued until the voltage alterations for the entire semiconductor component have been mapped.

BRIEF DESCRIPTION OF THE DRAWINGS

The present invention will be better understood from a reading of the following detailed description, taken in conjunction with the accompanying drawing figures in which like references designate like elements and in which.

DETAILED DESCRIPTION

Generally, the present invention provides a fixture and a method for testing or analyzing a semiconductor component such as, for example, a microprocessor. The fixture comprises a loadboard on which a switched capacitor network is mounted. The switched capacitor network couples a capacitance of a desired value to the loadboard when initializing the semiconductor component. The capacitance compensates for the "voltage droop" that occurs when the semiconductor component quickly switches states, and the power supply is unable to adjust its output voltage fast enough to compensate for the additional output power it needs to supply to the semiconductor component. Once the semiconductor component is initialized, the capacitance is removed from the power supply input connector and a voltage alteration signal is rastered across the semiconductor component while a constant current supply signal is applied to the power supply input connector of the fixture. During this mastering sequence, power supply voltage perturbations and their locations are recorded which provide an indication of the operational status at each point tested. This is particularly useful in determining why a semiconductor component has failed.

Figure 1:
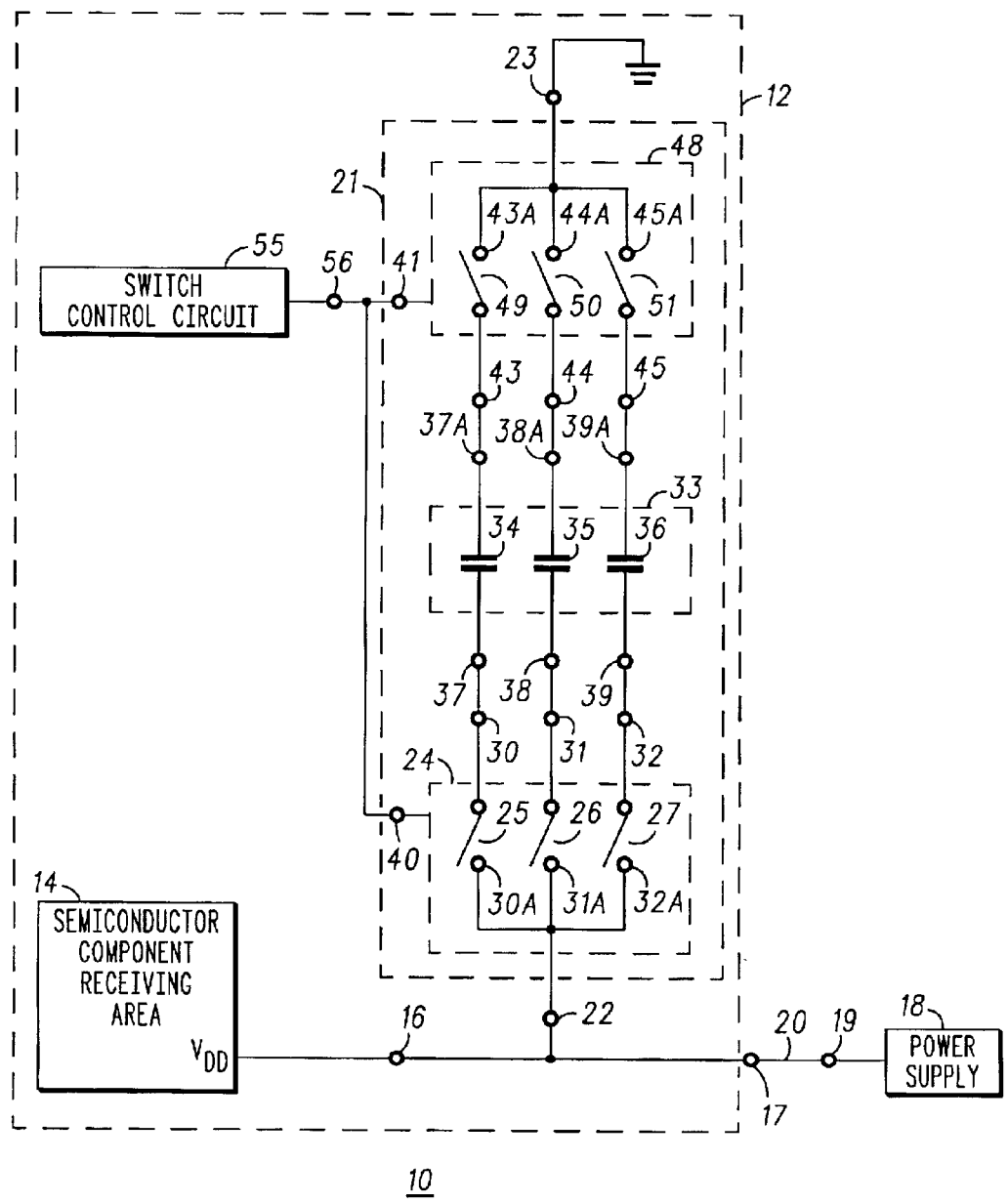
FIG. 1 is a top view of a fixture in accordance with an embodiment of the present invention.

FIG. 1 is a top view of a test fixture 10 in accordance with an embodiment of the present invention. Test fixture 10 includes a loadboard 12 having a semiconductor component receiving area 14. Loadboard 12 is also referred to as an interface structure or a support structure. Loadboard 12 is preferably a glass fabric-reinforced resin, such as epoxy, polyimide, triazine, or phenolic resin. Other suitable materials for loadboard 12 include bismaleimidetriazine (BT) resin, epoxy-glass composites, printed circuit board materials, and ceramic substrates. Semiconductor component receiving area 14 includes a power supply input terminal 16. Input terminal 16 is also referred to as a power pin. It should be understood that semiconductor component receiving area 14 has a plurality of input terminals for receiving power supply signals, input signals, and for transmitting output signals. However, for the sake of clarity these terminals have been omitted. An input terminal 17 of loadboard 12 is coupled for receiving a constant current power supply signal from a power supply 18. Power supply 18 has an output terminal 19 coupled to input terminal 17 via an interconnect 20. By way of example, power supply 18 is a 150 Ampere Elgar power supply having no internal capacitance. Because the 150 Ampere Elgar power supply has no internal capacitance, it is referred to as an unbuffered power supply and delivers an unbuffered supply signal to, for example, input terminal 17 and, thereby, to power supply input terminal 16. It should be understood that the particular pins to which the capacitance is coupled and decoupled is not a limitation of the present invention. For example, the capacitance can be coupled/decoupled to or from an input/output voltage supply, signal pins, and the like.

Because power supply 18 is an unbuffered power supply, it is desirable to have a load capacitance coupled to input terminal 16 during initialization of the component being tested. The component being tested or analyzed is also referred to as a device under test (DUT). More particularly, it is desirable to have a load capacitance coupled as close as possible to input terminal 16 of the component being tested. Without this capacitance, unbuffered power supply 18 would oscillate and transmit an unstable output voltage. A switched capacitor network 21 having an input/output terminal 22 and an input/output terminal 23 is mounted to loadboard 12. Input/output terminal 22 is coupled to power supply input terminal 16 and input/output terminal 23 is connected to ground. In accordance with one embodiment, switched capacitor network 21 comprises a switching network 24 coupled to another switching network 48 via a capacitor network 33. Switching network 24 has three switches 25, 26, and 27, where each switch has a pair of switching terminals 30–32 and 30A–32A. Switching network 48 has three switches 49, 50, and 51, where each switch has a pair of switching terminals 43–45 and 43A–45A. Capacitor network 33 has three capacitors 34, 35, and 36 each having a pair of terminals 37–39 and 37A–39A. Switching terminals 30A, 31A, and 32A of switch 24 are commonly connected to input/output terminal 22. Terminals 37,38, and 39 of capacitors 34, 35, and 36, respectively, are connected to switching terminals 30, 31, and 32, respectively. Terminals 37A, 38A, and 39A of capacitors 34, 35, and 36, respectively, are connected to switching terminals 43, 44, and 45, respectively, of switching network 48. Switching terminals 43A, 44A, and 45A of switching network 48 are commonly connected to input/output terminal 23. Input/output terminal 23 is connected to ground. Although switched capacitor network 21 is shown as a monolithically integrated component, it should be understood this is not limitation of the present invention. Switching networks 24 and 48 may be electronic switches, such as for example a Field Effect transistor (FET), a Bipolar Junction Transistor (BJT), an optical switch, or a mechanical switch such as, for example, a single-pull single throw toggle switch. A switch control circuit 55 having an output terminal 56 is coupled to control terminals 40 and 41 of switching networks 24 and 48, respectively, to control or set the switch configuration. A separate switch control circuit may be connected to each switching network. The type of switch control circuit is not a limitation of the present invention. An advantage of this embodiment is that capacitors 34, 35, and 36 can be decoupled from the semiconductor component, thereby preventing any stray capacitance from interfering with the test.

When the unbuffered power supply is a 150 Ampere Elgar power supply, a suitable capacitance is 90,000 microFarads ($\mu$Fs). Although switched capacitor network 20 is shown as a three capacitor switching unit, this is not a limitation of the present invention. For example, the 90,000 microFarads of capacitance could be implemented with ninety 1000 $\mu$F capacitors that are broken into thirty groups each containing three capacitors.

In accordance with another embodiment, switching network 48 is not present and terminals 37A, 38A, and 39A are commonly coupled to a ground potential. Because any stray capacitance will be connected to ground, this embodiment also offers the advantage that when decoupling capacitors 34, 35, and 36 from the semiconductor component any stray capacitance will only slightly interfere with the test, if at all. A benefit of this configuration is that it reduces any potential parasitic inductance by removing the entire switching network.

In accordance with yet another embodiment, switching network 48 remains in the switching configuration, while switching network 24 is omitted. In this embodiment terminals 37, 38, and 39 are connected to terminal 22.

Figure 2:
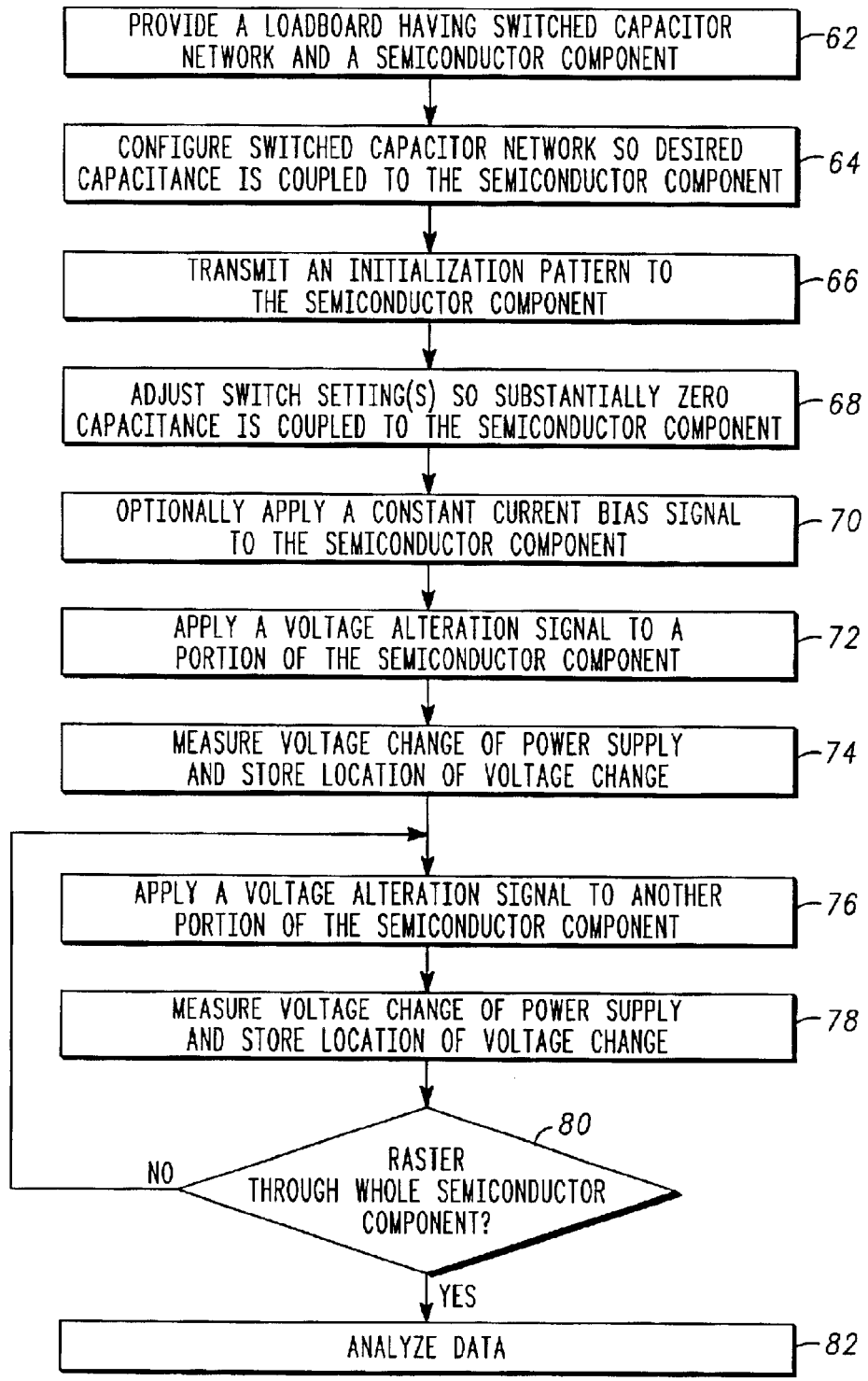
FIG. 2 is a flow chart of a method for analyzing a semiconductor component using the fixture of FIG. 1 in accordance with an embodiment of the present invention.

FIG. 2 is a flowchart 60 of a method for testing a semiconductor component in accordance with an embodiment of the present invention. In accordance with a first step (reference number 62), loadboard 12, having a semiconductor component mounted thereon is provided. The semiconductor component can be a microprocessor, a microcontroller, a programmable semiconductor component, or the like. Switched capacitor network 21 is configured so the desired capacitance is operatively coupled to the semiconductor component (reference number 64). By way of example, switch capacitor network 21 is configured so that a capacitance of 90,000 $\mu$F is coupled to a power supply input pin of the semiconductor component. It should be understood the value of the capacitance coupled to the semiconductor component is not a limitation of the present invention. Other suitable capacitance values include 10,000 $\mu$F, 20,000 $\mu$F, 30,000 $\mu$F, 40,000 $\mu$F, 50,000 $\mu$F, 60,000 $\mu$F, 70,000 $\mu$F, 80,000 $\mu$F, 100,000 $\mu$F, capacitance values intermediate to these values, and capacitance values greater than 100,000 $\mu$F.

A pattern of electrical signals or an initialization pattern is transmitted to the semiconductor component (reference number 66). In other words, the semiconductor component is initialized or placed in the correct state for analysis. By way of example, the pattern of electrical signals or initialization signal is transmitted to the semiconductor component by an IMS FT tester. The capacitance coupled to the semiconductor component provides additional power to compensate for "voltage droop" when the microprocessor changes state so quickly and draws such a large amount of power that power supply 18 is unable to compensate quickly enough. This ensures that the initialization pattern transmitted to the semiconductor component is accurate.

The switched capacitor network is then configured so that the capacitance value coupled to the input pin is substantially zero (reference number 68). Optionally, a constant current bias signal is transmitted to the semiconductor component (reference number 70). A voltage alteration signal is applied to a portion of the semiconductor component (reference number 72). By way of example, the voltage alteration signal is a light induced voltage alteration signal. Other suitable voltage alteration signals include a thermally induced voltage alteration signal, a charge induced voltage alteration signal, and the like. The voltage alteration signal causes small changes in the output voltage of the power supply. Because the voltage changes are small, it is desirable that the value of the capacitance coupled to the power supply input terminal be as small as possible and preferably zero. Any capacitance coupled to the power supply input terminal may filter out the voltage changes induced by the voltage alteration signal. The voltage change or output response is monitored, i.e., measured, and stored in a raster pattern in a computer (reference number 74). In other words, the coordinates of the voltage supply change and the magnitude of the voltage supply change are stored in an electronic medium or as hard copies.

The voltage alteration signal is applied to another portion of the semiconductor component (reference number 76) and the voltage change is measured and stored in a raster pattern in a computer (reference number 78). If there are portions of the semiconductor component that have not been tested, the processes indicated by reference numbers 76, 78, and 80 are repeated. Once the whole semiconductor component has been tested, the data is analyzed to determine where, for example, a failure in the semiconductor component has occurred (reference number 82). It should be understood that the present invention is not limited to testing the whole semiconductor component. For example, it may desirable to only test the portion of the semiconductor component containing cache memory. Thus, the present invention is suitable for testing a portion of the semiconductor component.

By now it should be appreciated that a test fixture and a method for testing a semiconductor component have been provided. An advantage of the present invention is that a capacitance can be coupled to a power supply pin of a semiconductor component to compensate for "voltage droop" during initialization of the semiconductor component. Then, the capacitance can be decoupled from the power supply input pin during testing to allow the monitoring of small voltage perturbations. Another advantage is that the present invention can be extended to controlling the supply capacitance for a power supply that uses external capacitance. In other words, the power supply capacitance can be changed using the switched capacitance of the present invention.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. An interface structure, comprising:
   a circuit board having an area adapted for accepting a microprocessor;
   a switched capacitor network mounted to the circuit board; and
   an input terminal coupled for receiving a pattern initialization signal when a capacitor from the switched capacitor network is coupled to an input of the microprocessor and coupled for receiving a constant electrical signal when the capacitor from the switched capacitor network is decoupled from the microprocessor.

2. A method for analyzing a semiconductor component, comprising:
   coupling a capacitance to the semiconductor component;
   transmitting an initialization pattern to the semiconductor component;
   decoupling the capacitance from the semiconductor component;
   applying a constant electrical signal of a first type to the semiconductor component; and
   monitoring an electrical signal of a second type from the semiconductor component, wherein the electrical signal of the second type indicates the operational status of the semiconductor component.

3. The method of claim 2, wherein applying a constant electrical signal includes applying a stimulus selected from the group of stimuli comprising light and heat.

4. The method of claim 2, wherein coupling and decoupling includes using a switched capacitor network to couple and decouple the capacitance.

5. The method of claim 4, wherein using the switched capacitor network includes using a mechanical switch in combination with the capacitance.

6. The method of claim 2, wherein the electrical signal of the first type is a current signal and the electrical signal of the second type is a voltage signal.

7. The method of claim 2, wherein transmitting an initialization pattern includes using a power supply adapted for transmitting the electrical signal of the first type in an unbuffered fashion.

8. The method of claim 2, wherein the semiconductor component is one of a microprocessor and a microcontroller.

* * * * *